US009496662B2

(12) United States Patent
Little et al.

(10) Patent No.: US 9,496,662 B2
(45) Date of Patent: *Nov. 15, 2016

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Jim Zhao, Irvine, CA (US); Chih-Pi Cheng, New Taipei (TW); Chun-Yi Chang, New Taipei (TW); Stephen Sedio, Valley Center, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/517,941

(22) Filed: Oct. 20, 2014

(65) Prior Publication Data
US 2015/0126069 A1 May 7, 2015

Related U.S. Application Data

(63) Continuation-in-part of application No. 14/454,737, filed on Aug. 8, 2014, and a continuation-in-part of application No. 14/477,889, filed on Sep. 5, 2014, and a continuation-in-part of application No. 14/337,180, filed on Jul. 21, 2014.

(51) Int. Cl.
*H01R 24/00* (2011.01)
*H01R 24/60* (2011.01)
(Continued)

(52) U.S. Cl.
CPC .......... *H01R 24/60* (2013.01); *H01R 13/6581* (2013.01); *H01R 12/724* (2013.01);
(Continued)

(58) Field of Classification Search
CPC ..................... H01R 23/7023; H01R 23/7005
USPC .................. 439/600, 626, 374, 377, 79, 733
See application file for complete search history.

(56) References Cited

U.S. PATENT DOCUMENTS 5,073,130 A    12/1991  Nakamura
6,139,363 A *  10/2000  Ko .................. H01R 43/16
                                               439/579
(Continued)

FOREIGN PATENT DOCUMENTS

CN         2604799        2/2004
CN       201230066 Y      4/2009
(Continued)

OTHER PUBLICATIONS

USB Type-C Specification 0.9c05—May 18, 2014.
(Continued)

*Primary Examiner* — Phuongchi T Nguyen
(74) *Attorney, Agent, or Firm* — Wei Te Chung; Ming Chieh Chang

(57) ABSTRACT

A flappable plug connector and a complementary receptacle connector are provided wherein the plug connector defining a mating tongue, is made with a pair of insert molding housings which are associated with the contacts thereof, commonly sandwiching a paddle card therebetween with a pair of power contacts exposed on two opposite lateral sides to form a sub-assembly. The corresponding receptacle connector defines a receiving cavity to receive the mating tongue of the plug connector. The plug connector defines a V-Bus clip surrounding the mating tongue for power transfer and the receptacle connector includes a pair of deflectable power contacts by two sides of the receiving cavity.

16 Claims, 31 Drawing Sheets

Related U.S. Application Data

(60) Provisional application No. 61/917,363, filed on Dec. 18, 2013, provisional application No. 61/899,276, filed on Nov. 3, 2013, provisional application No. 61/875,096, filed on Sep. 8, 2013, provisional application No. 61/916,147, filed on Dec. 14, 2013, provisional application No. 61/863,896, filed on Aug. 8, 2013, provisional application No. 61/866,037, filed on Aug. 14, 2013, provisional application No. 61/949,232, filed on Mar. 6, 2014, provisional application No. 61/867,584, filed on Aug. 19, 2013, provisional application No. 61/856,077, filed on Jul. 19, 2013, provisional application No. 61/857,687, filed on Jul. 23, 2013.

(51) Int. Cl.
*H01R 13/6581* (2011.01)
*H01R 107/00* (2006.01)
*H01R 12/72* (2011.01)
*H01R 13/642* (2006.01)
*H05K 1/11* (2006.01)
*H05K 1/18* (2006.01)

(52) U.S. Cl.
CPC ......... *H01R13/642* (2013.01); *H01R 2107/00* (2013.01); *H05K 1/117* (2013.01); *H05K 1/184* (2013.01); *H05K 2201/10189* (2013.01)

(56) References Cited

U.S. PATENT DOCUMENTS

| | | | | |
|---|---|---|---|---|
| 6,489,563 | B1* | 12/2002 | Zhao | H01R 9/0524 174/88 C |
| 6,666,696 | B1 | 12/2003 | Wu | |
| 6,755,689 | B2 | 6/2004 | Zhang et al. | |
| 6,890,220 | B2 | 5/2005 | Wang | |
| 7,114,981 | B1 | 10/2006 | Huang | |
| 7,445,469 | B2 | 11/2008 | Wu | |
| 7,534,150 | B2* | 5/2009 | Shen | H01R 12/712 439/752 |
| 7,758,379 | B2 | 7/2010 | Chen | |
| 7,909,648 | B2 | 3/2011 | Tai | |
| 8,087,944 | B2 | 1/2012 | Kumamoto et al. | |
| 8,251,746 | B2 | 8/2012 | Zhang | |
| 8,262,411 | B2 | 9/2012 | Kondo | |
| 8,439,576 | B2 | 5/2013 | Hsiao et al. | |
| 8,517,773 | B2 | 8/2013 | Lee et al. | |
| 8,562,378 | B2 | 10/2013 | Su | |
| 8,968,031 | B2 | 3/2015 | Simmel et al. | |
| 2010/0267261 | A1 | 10/2010 | Lin | |
| 2010/0297885 | A1* | 11/2010 | Cao | H01R 4/028 439/626 |
| 2010/0311258 | A1* | 12/2010 | Su | H01R 13/5213 439/136 |
| 2013/0095702 | A1 | 4/2013 | Golko et al. | |
| 2014/0024257 | A1 | 1/2014 | Castillo | |
| 2015/0056839 | A1 | 2/2015 | Zhang | |
| 2015/0155661 | A1* | 6/2015 | Chen | H01R 13/6594 439/607.01 |
| 2015/0162684 | A1 | 6/2015 | Amini et al. | |
| 2015/0171562 | A1 | 6/2015 | Gao et al. | |
| 2015/0214673 | A1 | 7/2015 | Gao et al. | |
| 2015/0214674 | A1 | 7/2015 | Simmel et al. | |
| 2015/0295362 | A1 | 10/2015 | Tziviskos et al. | |
| 2015/0340813 | A1 | 11/2015 | Ng et al. | |
| 2015/0340815 | A1 | 11/2015 | Gao et al. | |
| 2015/0340825 | A1 | 11/2015 | Ng et al. | |

FOREIGN PATENT DOCUMENTS

| | | |
|---|---|---|
| CN | 201282235 | 7/2009 |
| CN | 201392942 | 1/2010 |
| CN | 201523122 | 7/2010 |
| CN | 201623280 U | 11/2010 |
| CN | 201741935 | 2/2011 |
| CN | 201741937 U | 2/2011 |
| CN | 201868687 | 6/2011 |
| CN | 201887230 | 6/2011 |
| CN | 102544812 | 7/2012 |
| CN | 202423735 U | 9/2012 |
| CN | 202737282 U | 2/2013 |
| CN | 103081253 A | 5/2013 |
| CN | 203242848 | 10/2013 |
| CN | 103579835 | 2/2014 |
| CN | 203481540 | 3/2014 |
| JP | 2008300119 | 12/2008 |
| JP | 5873173 | 10/2014 |
| TW | M288035 | 2/2006 |
| TW | M357077 | 5/2009 |
| TW | M414692 | 10/2011 |
| TW | M443957 | 12/2012 |
| TW | M454654 | 6/2013 |
| TW | I427870 | 2/2014 |
| WO | WO2013020359 | 2/2013 |

OTHER PUBLICATIONS

Universal Serial Bus Type-C Cable and Connector Specification Revision 1.0 Aug. 11, 2014.
Universal Serial Bus Type-C Cable and Connector Specification Revision 0.7 Working Draft Jan. xx, 2014.

\* cited by examiner

FLIPPABLE ELECTRICAL CONNECTOR

CROSS REFERENCE TO RELATED APPLICATIONS

This application is a continuation-in-part of Ser. No. 14/477,889 filed Sep. 5, 2014, a continuation-in-part of Ser. No. 14/454,737 filed Aug. 8, 2014, a continuation-in-part of Ser. No. 14/337,180 filed Jul. 21, 2014, and claims the benefit of, and priority to, U.S. Provisional Patent Application No. 61/899,276, filed Nov. 3, 2013, No. 61/917,363, filed Dec. 18, 2013, the contents of which are incorporated entirely herein by reference. This application relates to another copending application Ser. No. 14/497,205.

BACKGROUND OF THE INVENTION

1. Field of the Invention

The present invention relates to an electrical connector, and more particularly to a flappable plug connector used with a receptacle connector.

2. Description of Related Art

US Patent Publication No. 20130095702A1 discloses a dual orientation plug connector, which has a connector tab with first and second major opposing sides and a plurality of electrical contacts carried by the connector tab. The plurality of contacts may include a first set of external contacts formed at the first major side and a second set of external contacts formed at the second major side. The first plurality of contacts may be symmetrically spaced with the second plurality of contacts and the connector tab may be shaped to have 180 degree symmetry so that it can be inserted and operatively coupled to a corresponding receptacle connector in either of two insertion orientations.

A receptacle connector corresponds to the plug connector. A sensing circuit in the receptacle or the electronic device in which the receptacle connector is housed can detect the orientation of the contacts and switch internal connections to the contacts in the connector jack as appropriate. When the contacts are more, the sensing circuit is more complicated, which will waste software switches or hardware switches.

Hence, a new and simple electrical plug connector and the complementary receptacle connector are desired.

SUMMARY OF THE INVENTION

Accordingly, the object of the present invention is to provide a flappable plug connector and a complementary receptacle connector wherein the plug connector defining a mating tongue, is made with a pair of insert molding housings which are associated with the stationary contacts thereof, commonly sandwiching a paddle card therebetween with a V-Bus clip surrounding the paddle card partially with a pair of retention recesses on two opposite lateral sides to form a sub-assembly. A pair of metallic shells are assembled unto two opposite surfaces of said sub-assembly to commonly sandwich the sub-assembly therebetween while exposing the mating sections of the contacts. A pair of ribs are formed on two opposite surfaces of the mating tongue to prevent mis-insertion of the plug connector into another wrong receptacle due to the similar dimension in the vertical direction.

The corresponding receptacle connector includes an insulative housing defining a mating cavity therein, for receiving the mating tongue of the plug connector, with two rows of deflectable contacts disposed in the housing and located by two sides of the mating cavity in a vertical direction for coupling to the stationary contacts of the plug connector. A pair of deflectable power contacts disposed in the housing and located by two sides of the mating cavity in a horizontal direction for coupling to the V-Bus clip. A metallic shell encloses the housing wherein the shell cooperates with the insulative housing to intentionally define an effective receiving cavity dimensionally smaller than another plug with the similar dimension in both the vertical direction and the lateral direction so as to prevent to receive such an erroneous plug therein.

Other objects, advantages and novel features of the invention will become more apparent from the following detailed description when taken in conjunction with the accompanying drawings.

DETAILED DESCRIPTION OF THE PREFERRED EMBODIMENT

Figure 2:
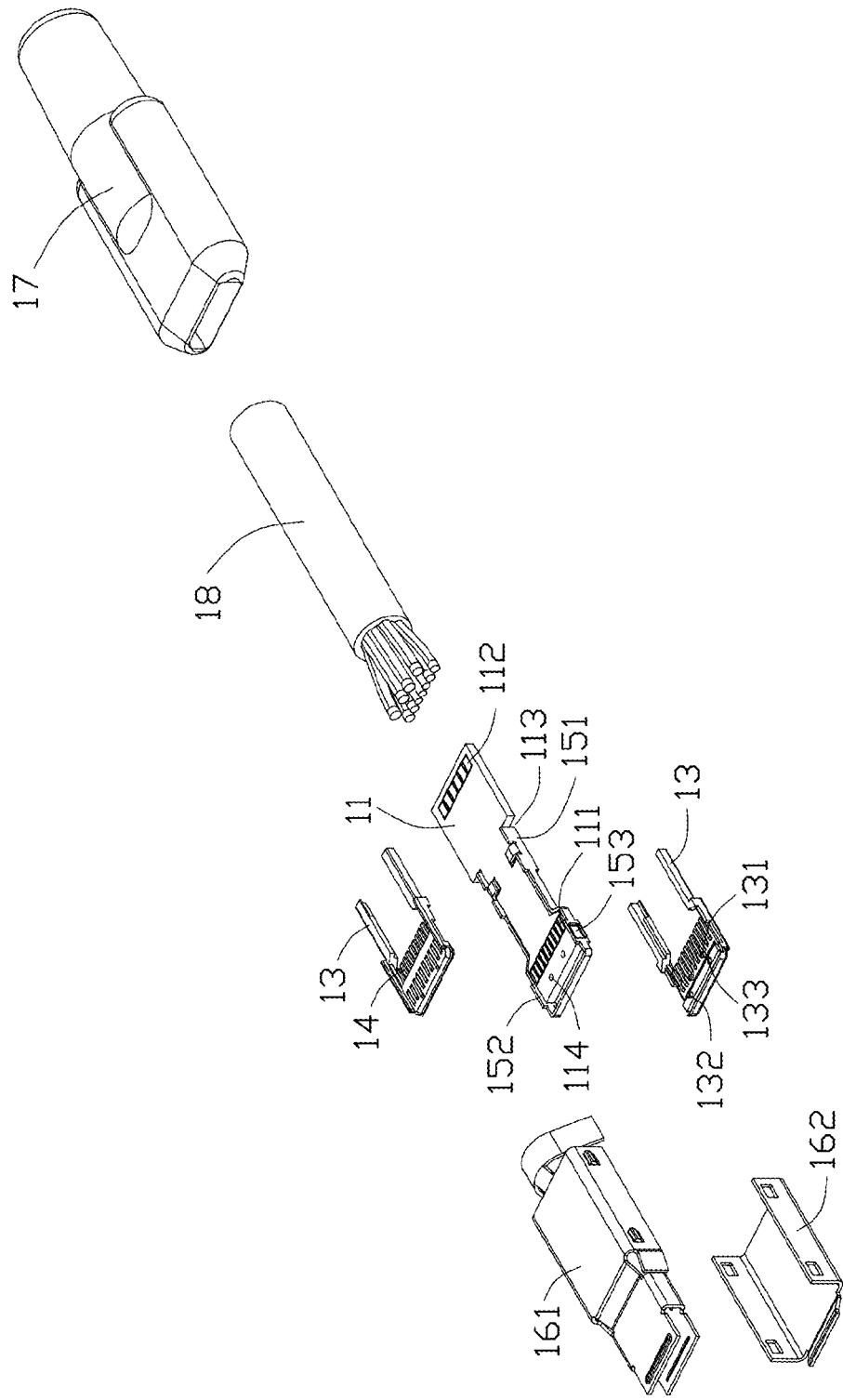
FIG. 2 is an exploded perspective view of the plug connector of FIG. 1.
Figure 3:
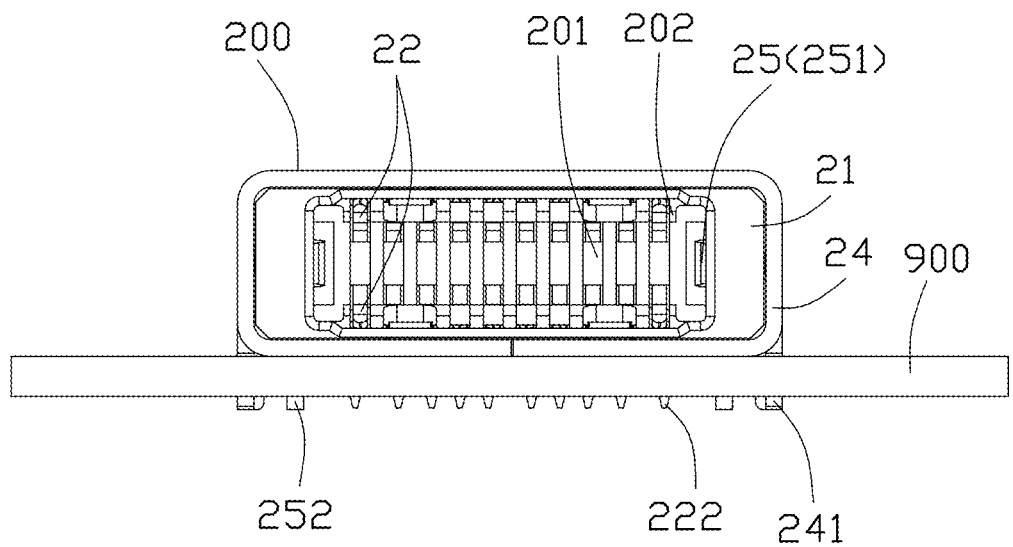
FIG. 3 is a front elevational view of a receptacle connector for mating with the plug connector of FIG. 1.
Figure 4:
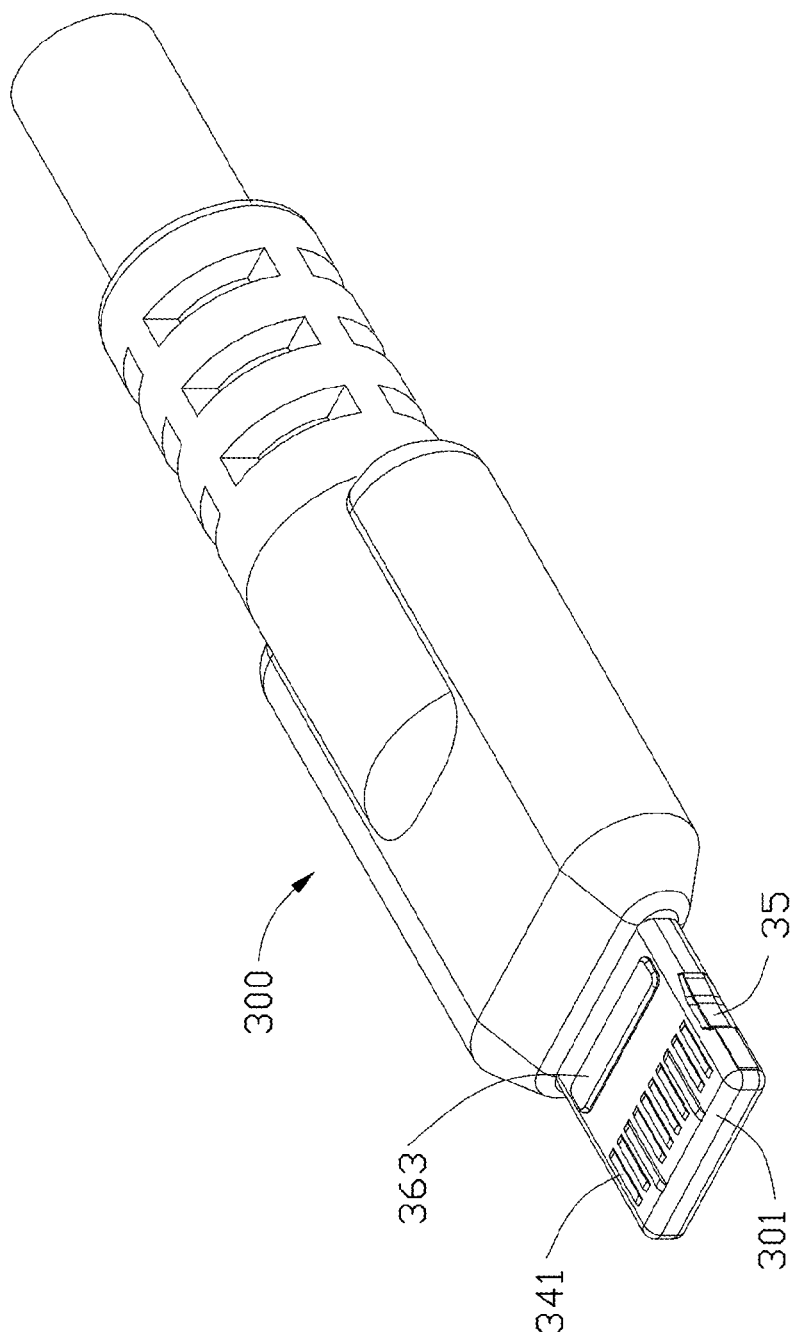
FIG. 4 is an assembled perspective view of a plug connector according to a second embodiment of the present invention.
Figure 5:
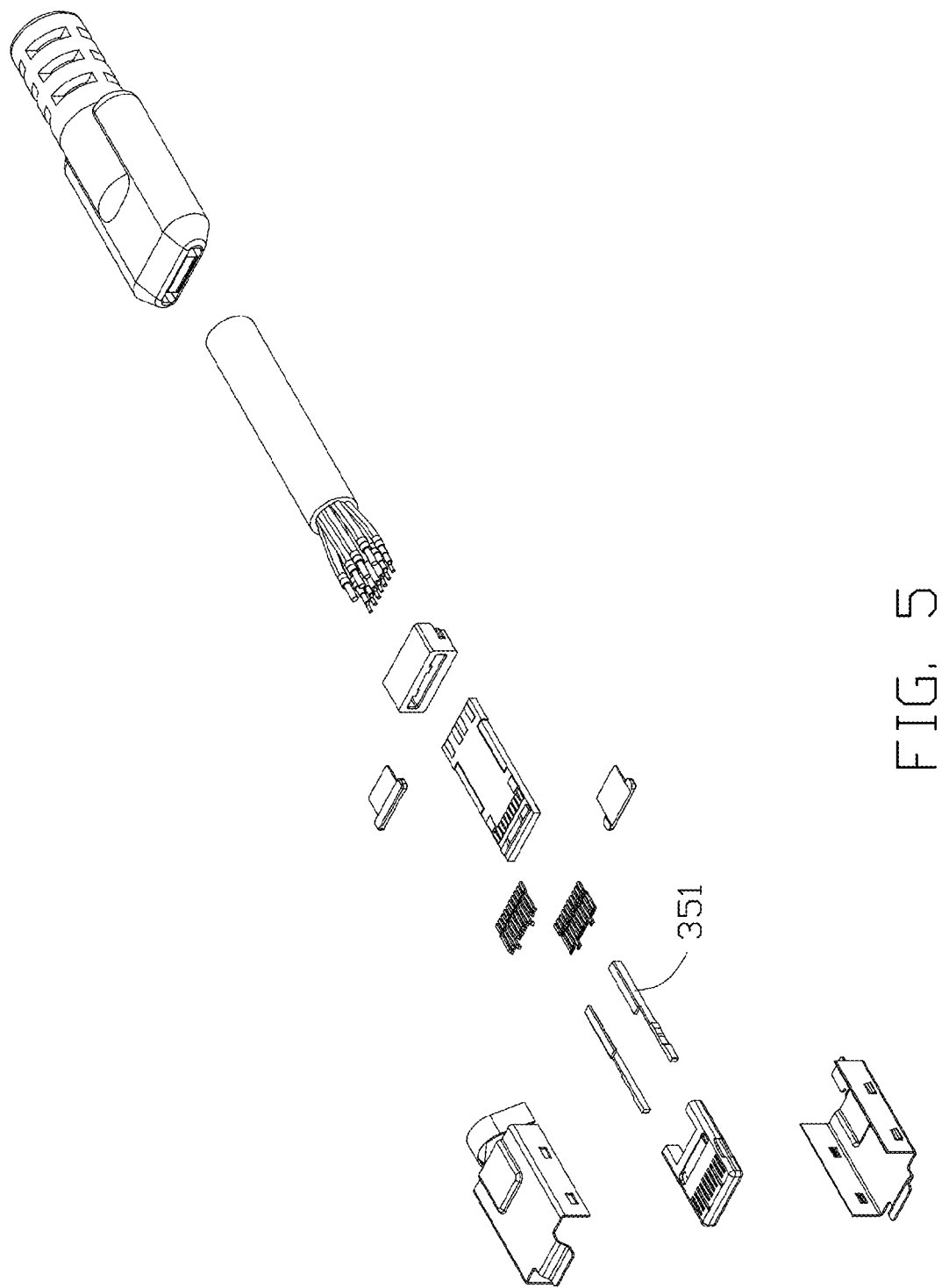
FIG. 5. is an exploded perspective view of the plug connector of FIG. 4.
Figure 6:
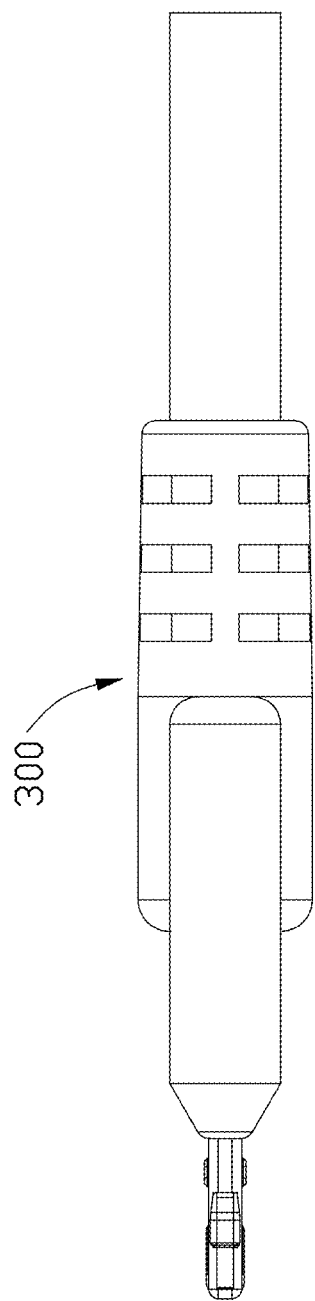
FIG. 6 is a side elevational view of the plug connector of FIG. 4.
Figure 7:
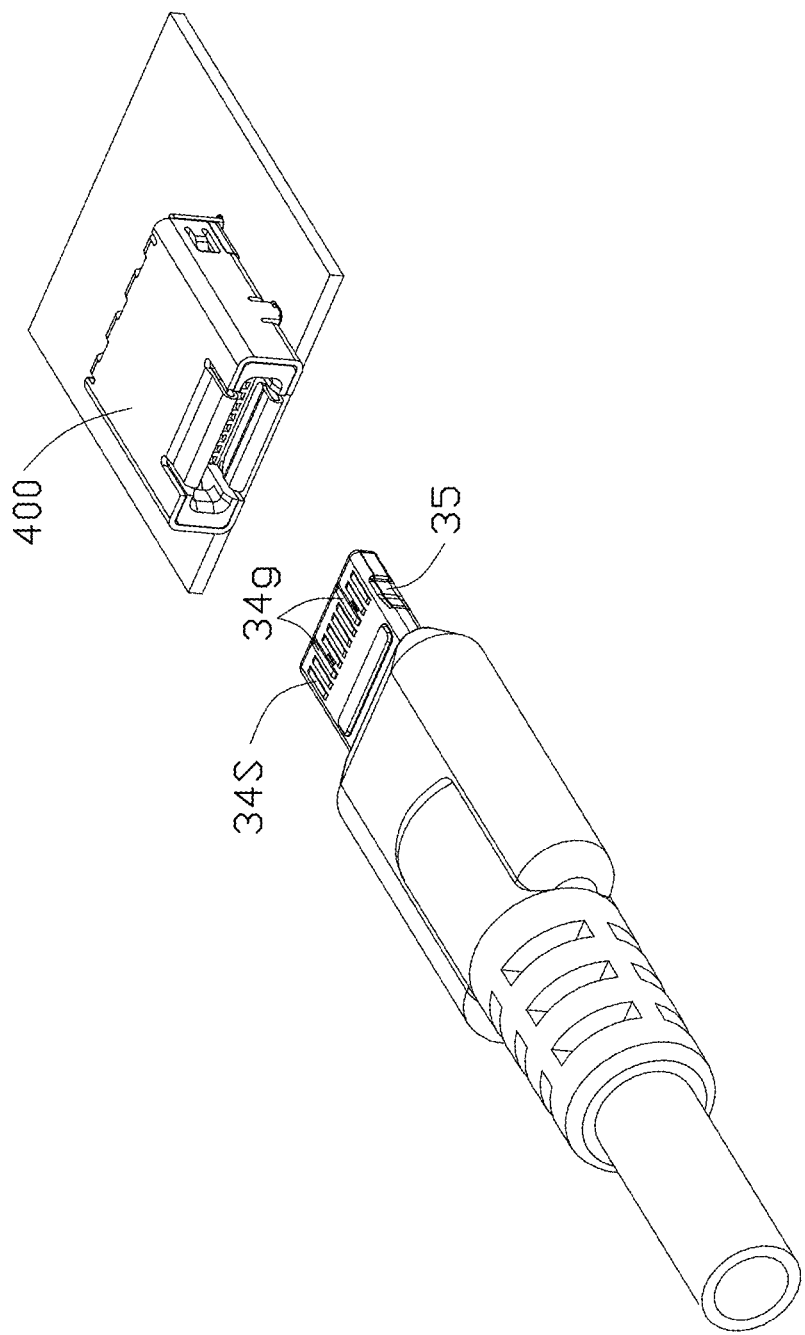
FIG. 7 is a perspective view of the plug connector of FIG. 4 and a receptacle connector which is designedly to mate with the plug connector of FIG. 4.
Figure 8:
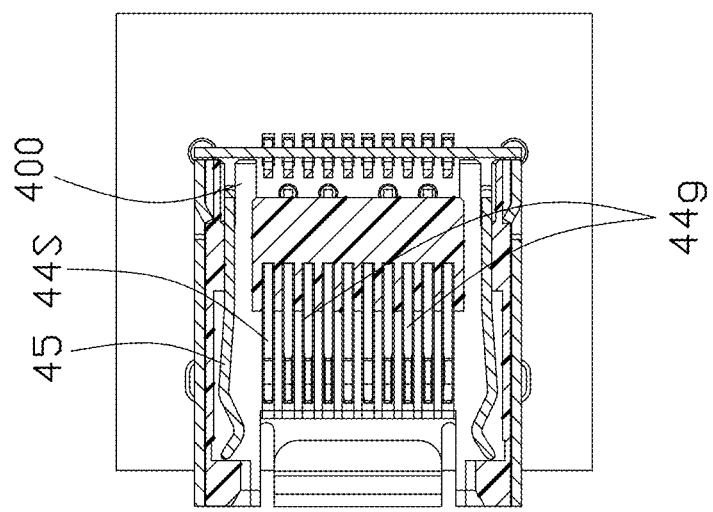
FIG. 8 is a cross-sectional illustrative view of the plug connector and the receptacle connector of FIG. 7 to show the stage of the power contacts work when un-mating.
Figure 8:
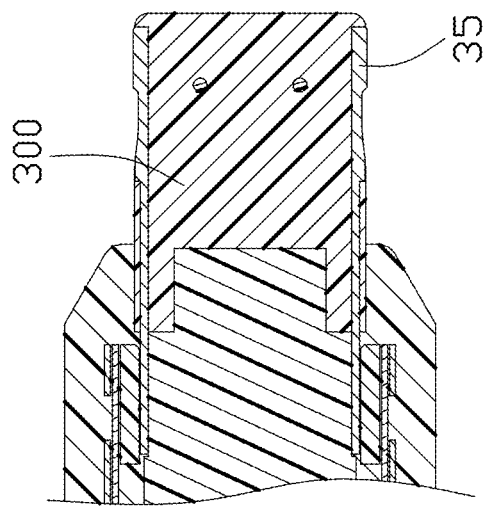

Reference will now be made in detail to the preferred embodiment of the present invention Referring to FIGS. 1-2, the instant invention discloses a plug connector 100 of a first embodiment, which is adapted for mating with a receptacle connector 200 as show in FIG. 3. The plug connector 100 includes a paddle card 11 with front circuit pads 111 and rear circuit pads 112 on two opposite surfaces, and a housing unit including a pair of identical housings 13 commonly sandwiching the paddle card 11 therebetween. Each of the housings 13 is equipped with a plurality of contacts 14 therein via an insert molding process wherein the contacts are mechanically and electrically connected to the corresponding front circuit pads 111, respectively. A metallic U-shaped V-Bus clip or power/grounding contact 15 surrounds the paddle card 11 except a rear end region of the paddle card 11. The rear end 151 of the clip 15 is mechanically received in and electrically terminated at a corresponding slot 113 of the paddle card 11, and a front portion 152 of the clip 15 defines a pair of retention recesses 153 for engagement with a pair of corresponding deflectable power/grounding contacts 25 of the receptacle connector 200 as shown in FIG. 3. Each of the housings 13 includes the pegs 131 received in the corresponding holes 114 in the paddle card 11. Each of the housing 13 further includes a post 132 and a recess 133 respectively coupled to those of the other during assembling. The housings 13 are ultrasonically welded together with therebetween a slot in which the V-Bus clip 15 is received. The pair of housings 13 with the internal paddle card 11, the associated power contact 15 and contacts 14 are formed as a sub-assembly (not labeled). Opposite first shell 161 and second shell 162 are assembled together to commonly sandwich the aforementioned sub-assembly therein. Each shell 161, 162 includes an EMI touch pad 163 located behind contacting sections 141 of the contacts 14. The front portions of the housings 13 form a mating tongue 101 with the contacting sections 141 and the touch pads 163 exposed to an exterior thereon. An overmolded cover 17 is applied upon exterior surfaces of the shells 161 and 162, and a cable 18 is mechanically and electrically connected to the paddle card 11 and extends rearward out of the overmolded cover 17.

Referring to FIG. 3, the plug connector 100 is mateable with the complementary receptacle connector 200 mounted upon a mother board 900. The receptacle connector 200 includes an insulative housing 21 defining a receiving cavity 201 to receive the mating tongue 101 of the housings 13. Two rows of contacts 22 deflectable in the vertical direction, are disposed in the corresponding passageways (not labeled) of the housing 21 and by opposite two upper and lower sides of the receiving cavity 201 for mating with the contacts 14 of the plug connector 100. Each of the contacts 22 includes a front mating section (not labeled) for mating with the contacts 14 of the plug connector 100, a tail section 222 for mounting to the mother board 900, and a retention section (not shown) therebewteen for retaining the contact 22 in the housing 21. A pair of power contacts 25 deflectable in the lateral direction, are located in the housing 21 and by opposite two lateral sides of the receiving cavity 201 for electrically mating with and mechanically retaining to the power contacts 15 of the plug connector 100. Each of the power contacts 25 includes a front contacting section 251 for receivable engagement within the retention recess 153 of the power contact 15 of the plug connector 100, and a rear tail section 252 for mounting to the mother board 900, and therebetween an intermediate section (not shown) laterally offset from the front contacting section 251 and the rear tail section. The receptacle connector 200 further includes a metallic shell 24 enclosing the housing 21 with a plurality of legs 241 extend downwardly beyond a bottom face of the shell for mounting to the mother board 900.

Figure 1:
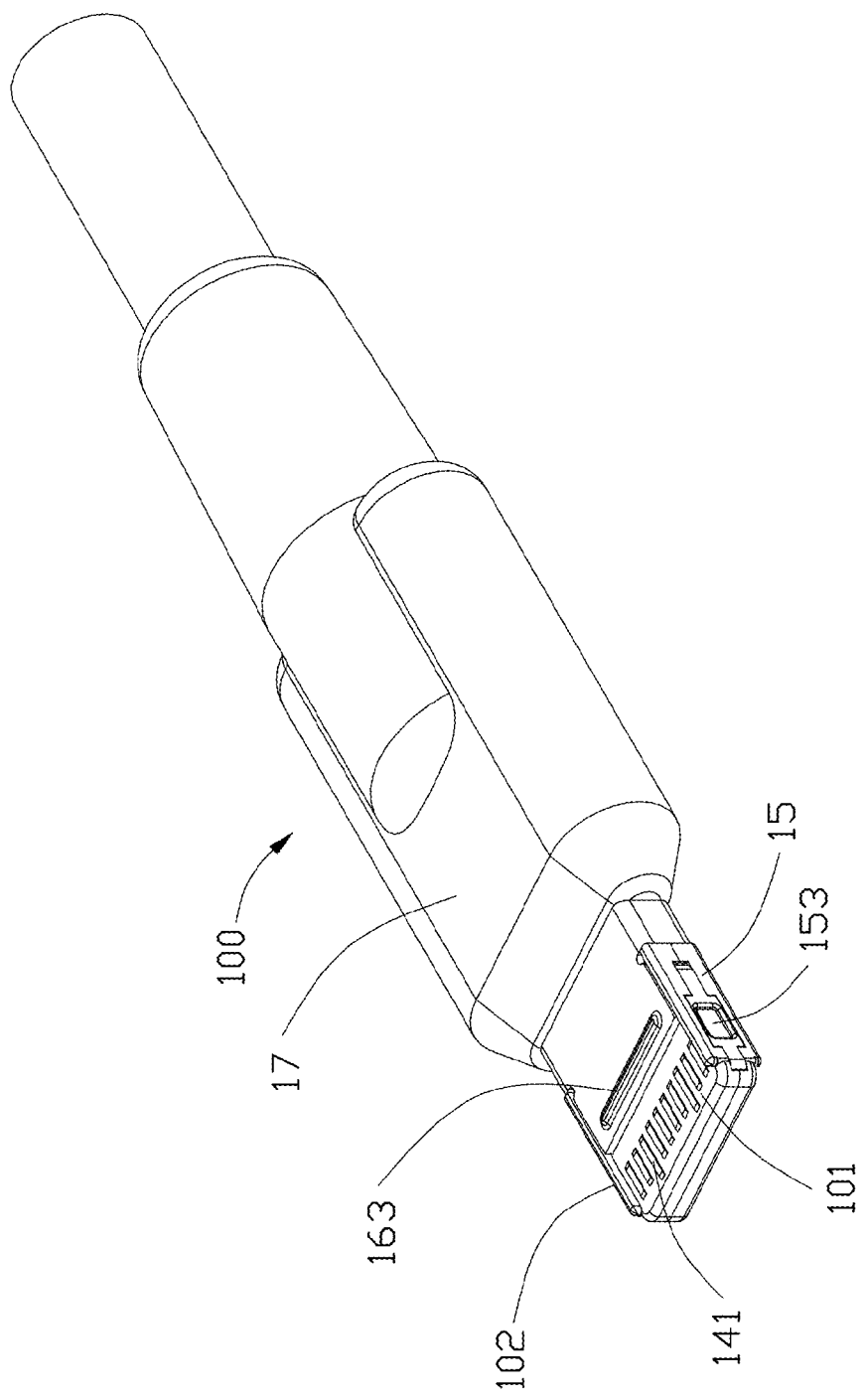
FIG. 1 is an assembled perspective view of a plug connector according to a first embodiment of the present invention.

The mating tongue 101 of the plug connector 100 includes a pair of alignment/anti-mismating ribs 102 on each of the opposite surfaces thereof as best shown in FIG. 1. The receptacle connector 200 defines the corresponding alignment/anti-mismating slots 202 as shown in FIG. 3 to receive those ribs 102 during mating. To avoid mistakenly mate with the wrong counterpart having the similar dimensions during mating, there are some mis-insertion means used by the instant invention. On one hand, on the receptacle connector 200, the effective height of the receiving cavity 201 is 1.25 mm which prevents the wrong plug with the 1.5 mm height mating tongue from insertion. Also, the effective transverse dimension of the receiving cavity 201 is 5.9 mm which prevents the wrong plug with the 6.7 mm transverse dimension. In other words, the receiving cavity 201 forms two zones wherein zone one defines clearance for mating the contacting sections 141 of the corresponding plug connector 100 and zone two defines clearance cooperating with the slots 202 for mating the ribs 102. On the other hand, on the plug connector 100, the ribs 102 on the mating tongue defines the 1.7 mm height for reception within the pair of corresponding slots 202 with the 1.75 mm vertical dimension, while being prohibited from insertion into another receiving cavity of the wrong receptacle having only the 1.6 mm height. Oppositely, the plug connector with the 5.8 mm transverse dimension with the ribs 102 may be correctly and compliantly inserted into the corresponding receptacle connector 200 with the 5.9 mm transverse dimension of the receiving cavity 201.

Figure 9:
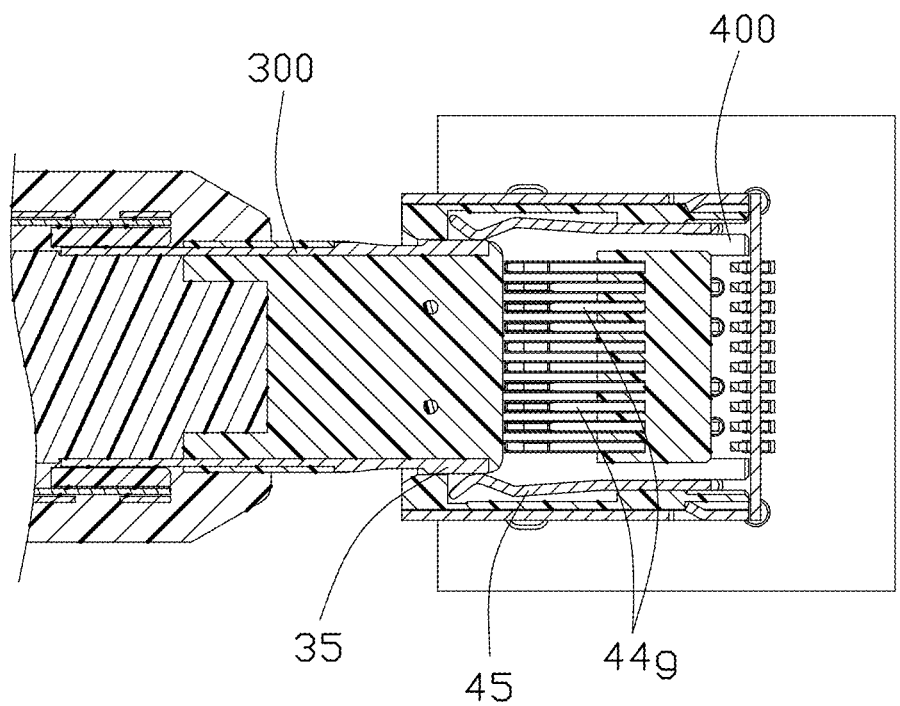
FIG. 9 is a cross-sectional illustrative view of the plug connector and the receptacle connector of FIG. 7 to show the stage of the power contacts work at during mating.
Figure 10:
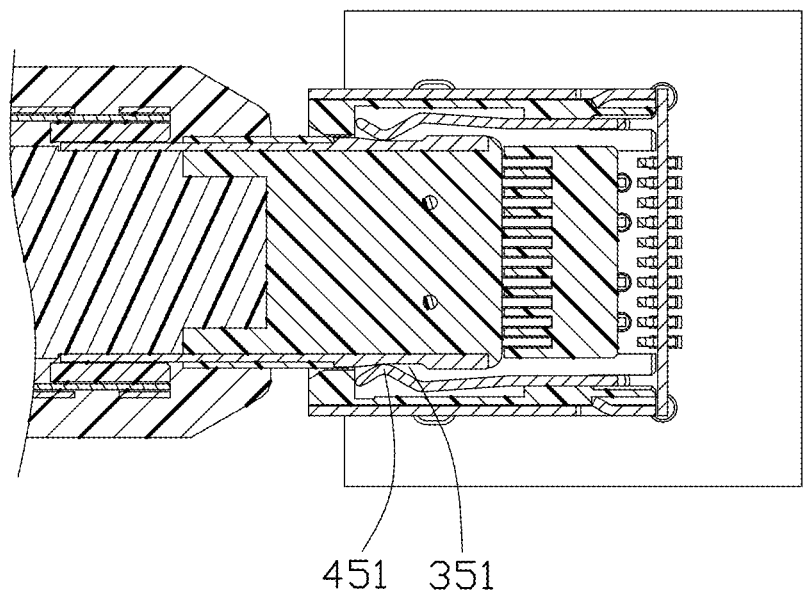
FIG. 10 is a cross-sectional illustrative view of the plug connector and the receptacle connector of FIG. 7 to show the stage of the power contacts work when completely mating.

In a second embodiment similar to the first embodiment, as shown in FIGS. 4-10 the plug connector 300 has the touch pad 363 above the corresponding signal contacts 341 with 0.12 mm height on the mating tongue 301. In this embodiment, the V-Bus clip 35 is divided into two V-Bus/latch pins 351 on two opposite lateral sides. Different from what is disclosed in the previous design disclosed in the previously filed provisional applications, the pins 351 extend toward and terminates at a front edge of the mating tongue for not only enhancing durability but also providing ESD discharge as shown in FIGS. 9-10.

Combination with FIG. 7-10, there is a safe distance of 1.35 mm so that during mating, before the signal contacts 34s, 44s of the plug connector and the receptacle connector are mated, the power pins 35 of the plug connector 300 and the power contacts 45 of the receptacle connector 400 are first mated. Notable, the power contacts are "ESD grounds" until the "CC" pins 44g make contact to start power. Also, because of such a safe distance, there is no risk of ESD getting into any signal pin even as the plug connector 300 is incautiously inserted in a tilting manner. Then, during mating the V-Bus (power) pins 35, 45 touch first while not powered yet, so it is essentially a "ground" at this point. The power contact is not sensitive to the capacitance associated with ESD suppression. Then, during mating the V-Bus pins 34g and the (long) signal ground pins 44g touch, thus doubly assuring no accidental discharge. The signal ground pins are 0.6 mm longer than the signal and "CC" pins. Last as shown in FIG. 10, the signal and "CC" pins are mated with each other, and power is now turned on.

Figure 11:
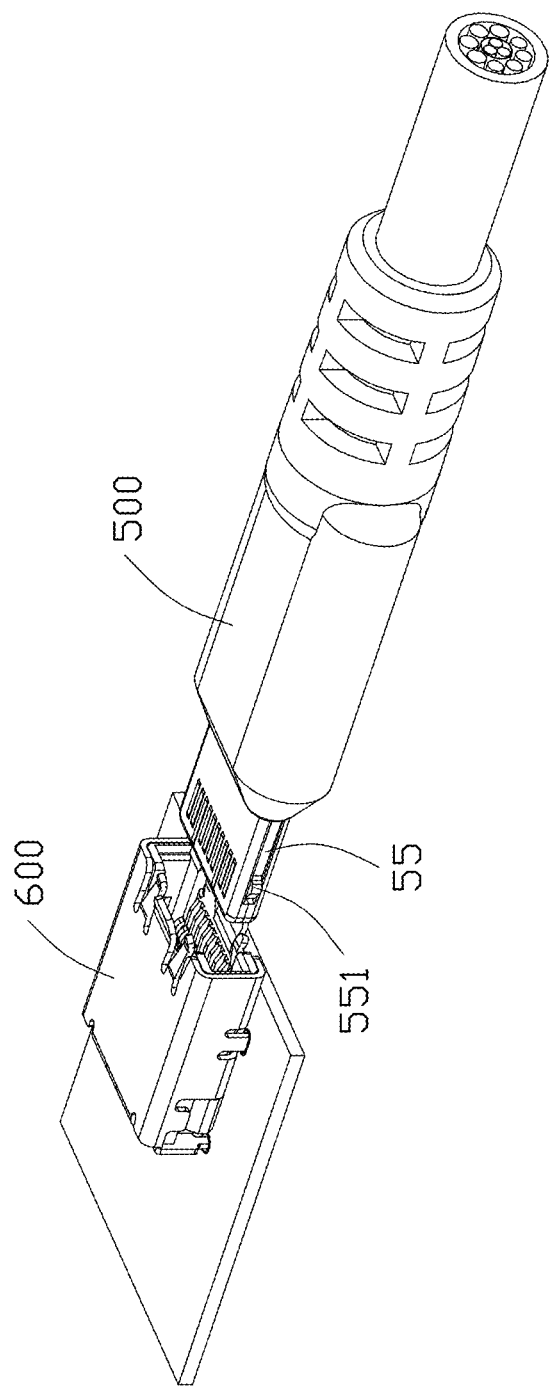
FIG. 11 is an assembled perspective view of a plug connector and a receptacle connector according to a second embodiment of the present invention.
Figure 12:
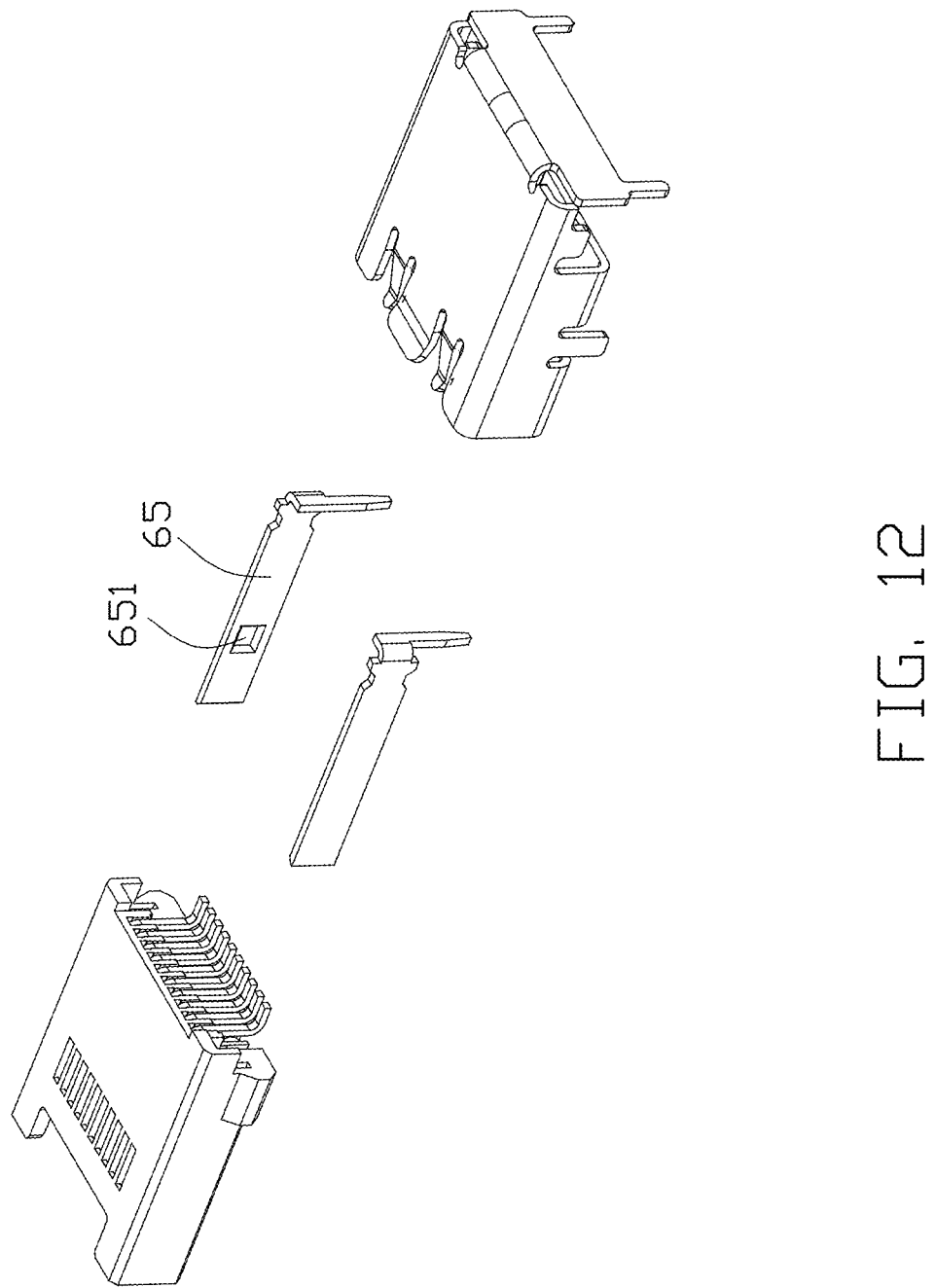
FIG. 12 is an exploded perspective view of the receptacle connector of FIG. 11.
Figure 13:
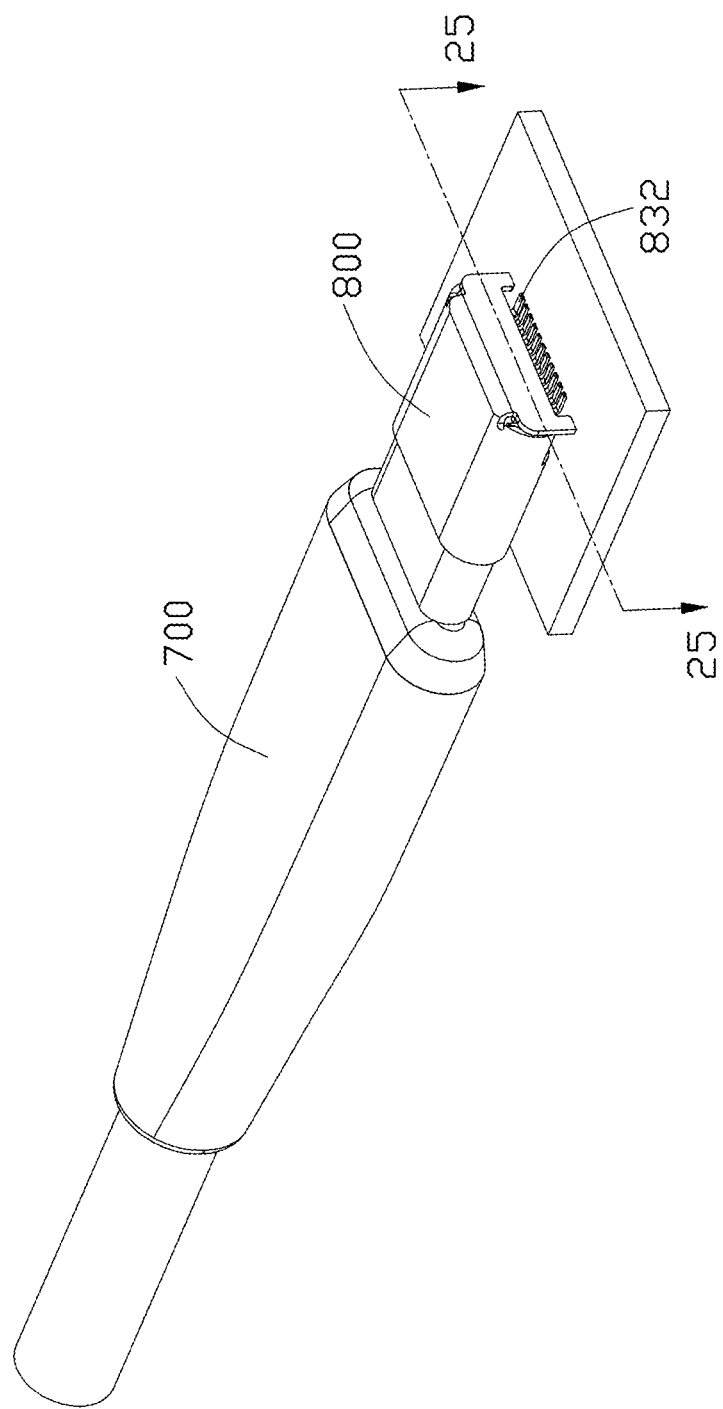
FIG. 13 is an assembled perspective view of a plug connector and a receptacle connector mating with each other, according to a fourth embodiment of the present invention.
Figure 14:
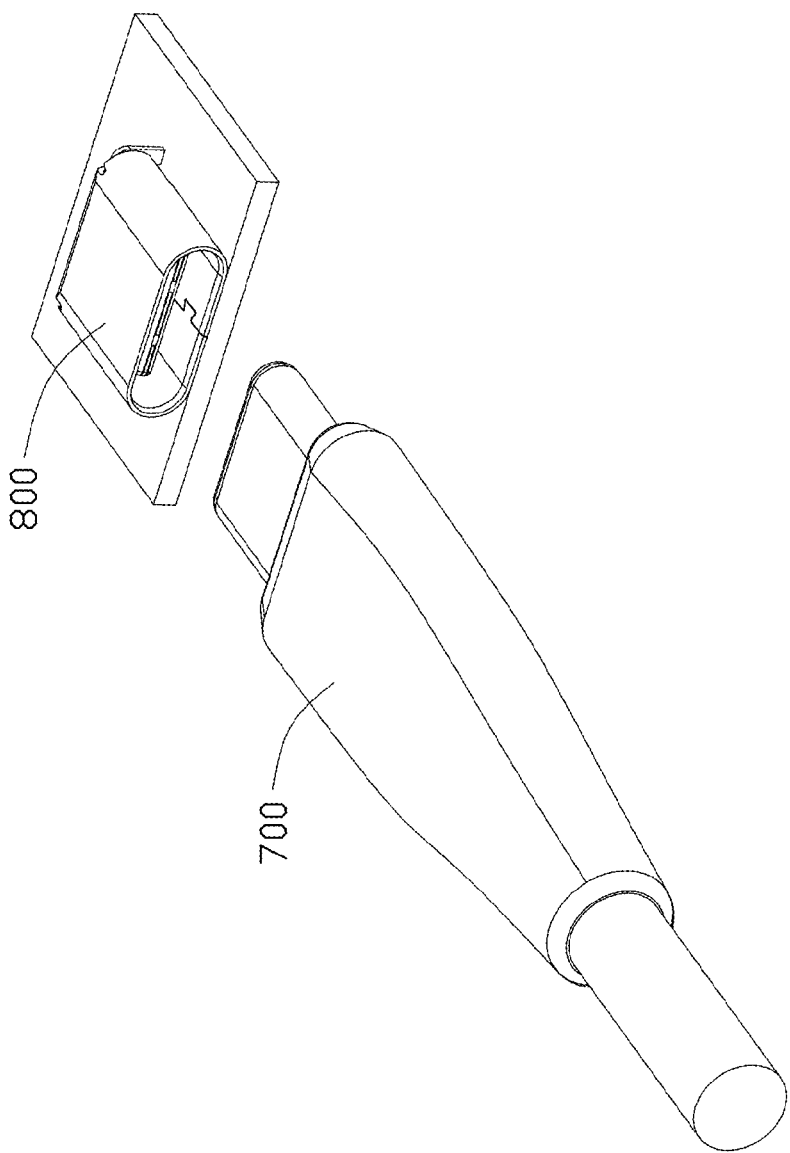
FIG. 14 is a perspective view of un-mating the plug connector and the receptacle connector of FIG. 13.
Figure 15:
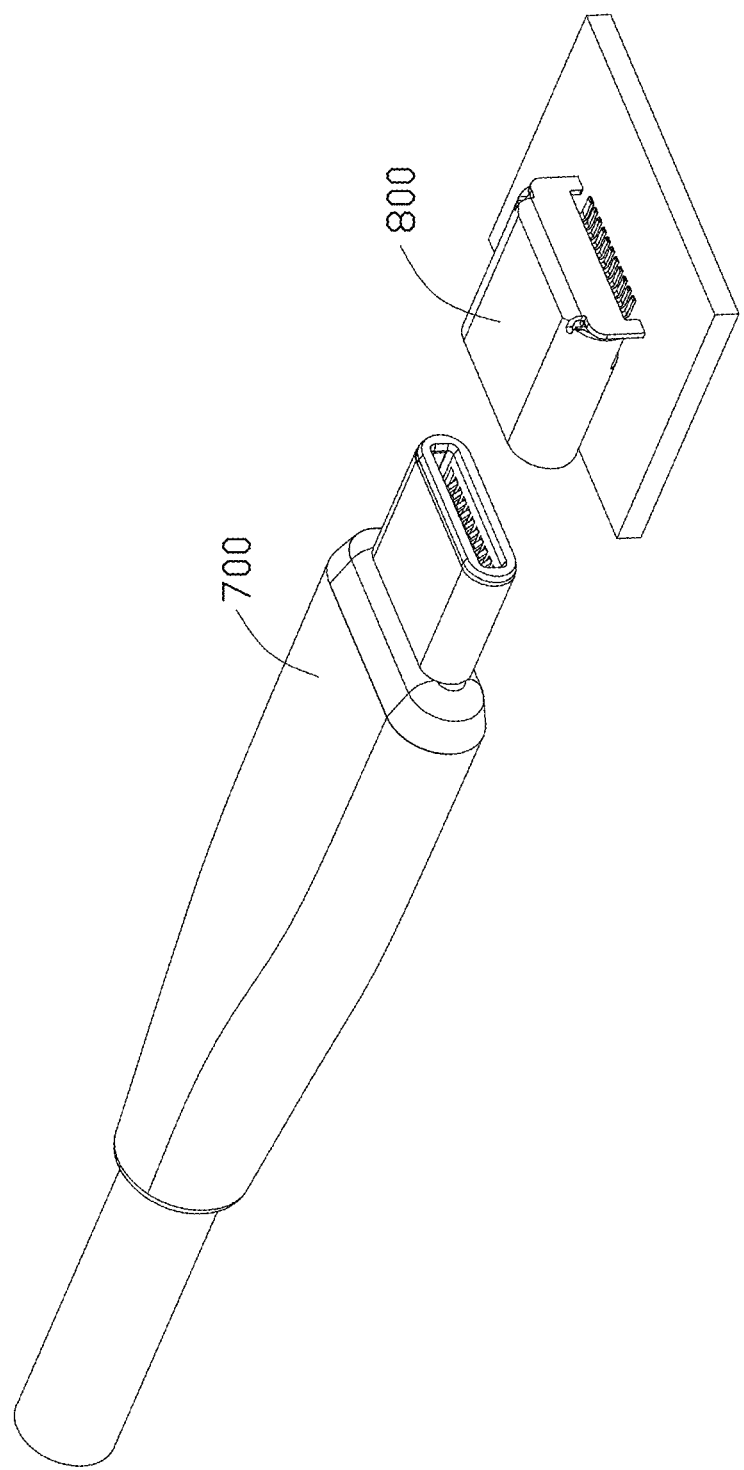
FIG. 15 is another perspective view of un-mating the plug connector and the receptacle connector of FIG. 14.

FIGS. 11-12 show a third embodiment on the V-Bus/power contacts still with the latching function. The power contacts 65 of the receptacle connector 600 are of a blade type without deflection but with a retention recess 651 therein. In opposite, the plug connector 500 is equipped with the spring loaded power contacts 55 with outward arc portions 551 on two lateral sides for engagement within the corresponding retention recesses 651, respectively.

Referring to FIGS. 13-25 showing a fourth embodiment of the instant invention, which discloses a plug connector 700 and a receptacle connector 800 mounted upon the printed circuit board.

Figure 16:
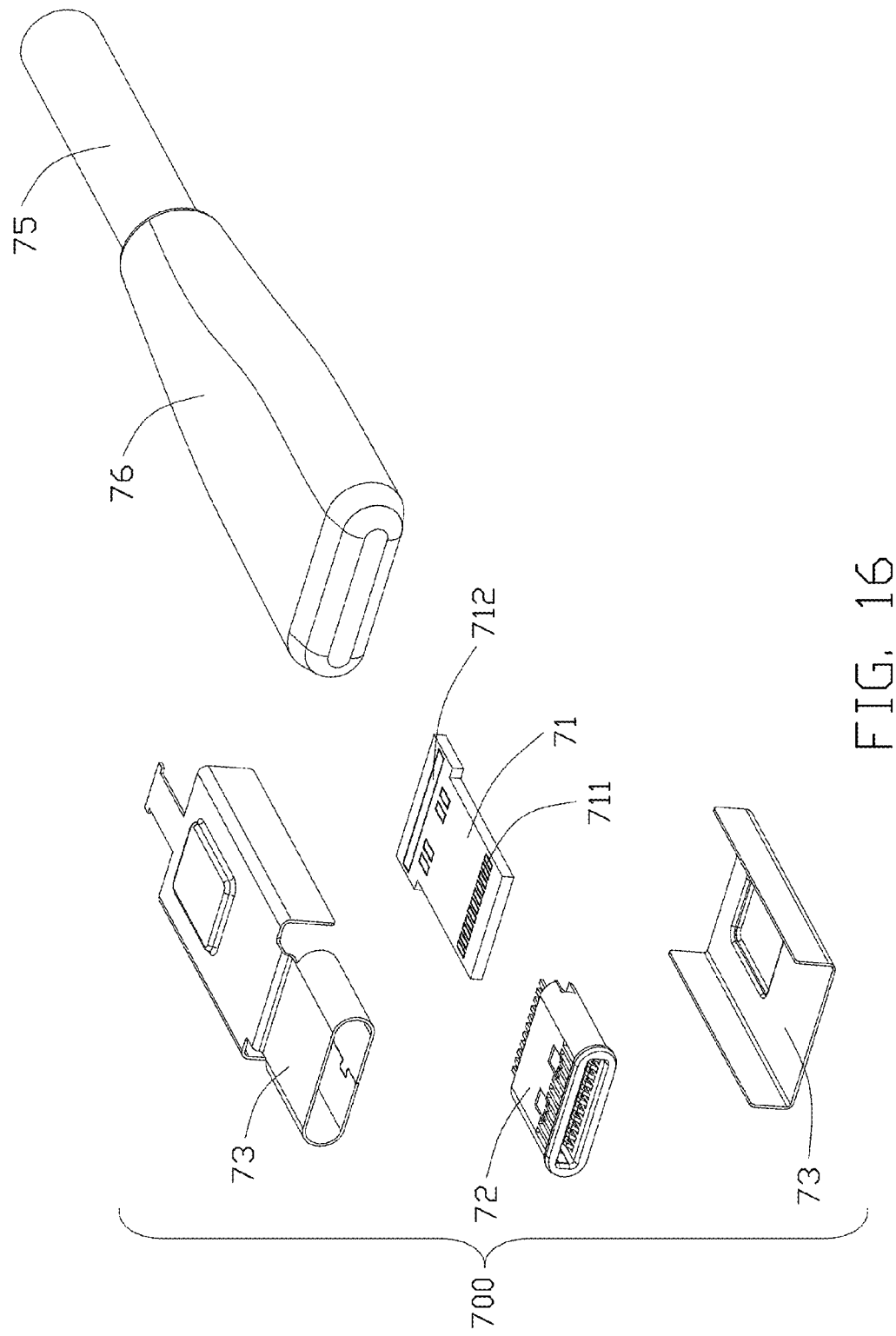
FIG. 16 is an explode perspective view of the plug connector of FIG. 15.
Figure 17:
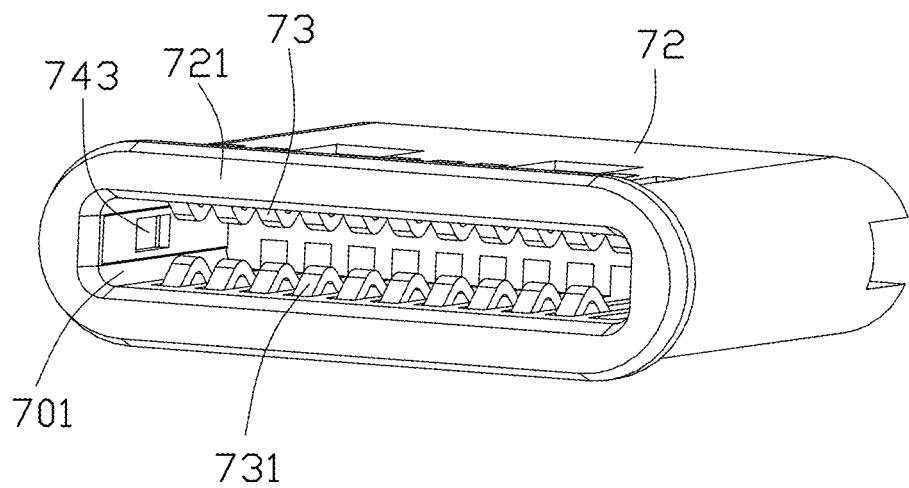
FIG. 17 is a partially assembled front perspective view of a subassembly of the plug connector of FIG. 15.
Figure 18:
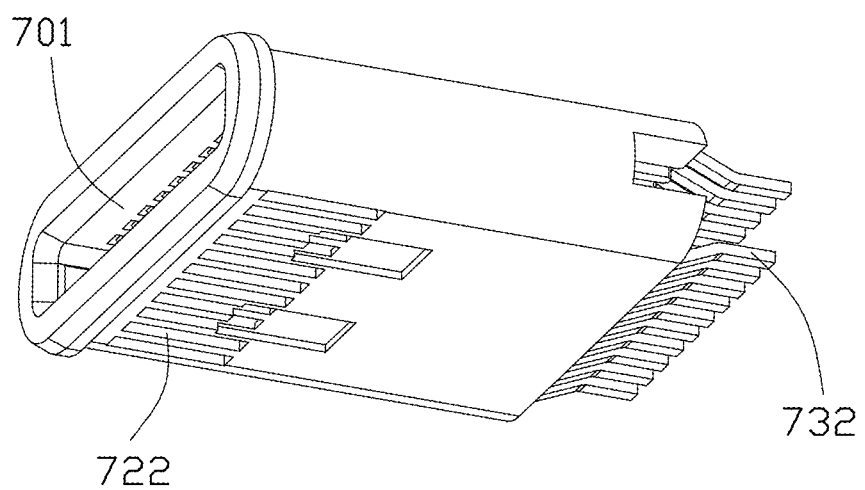
FIG. 18 is a partially assembled bottom perspective view of the subassembly of the plug connector of FIG. 17.
Figure 19:
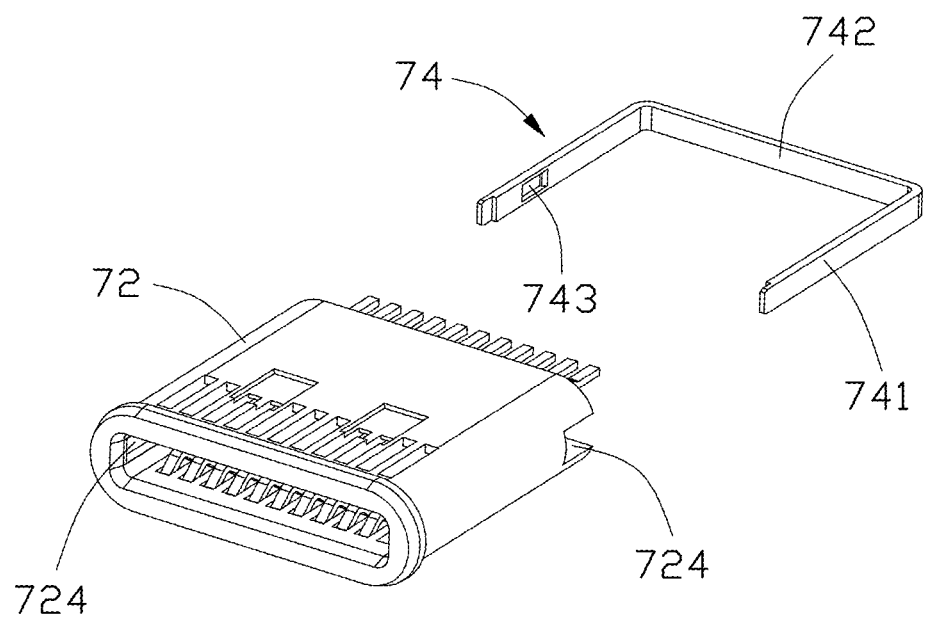
FIG. 19 is an exploded front perspective view of the subassembly of the plug connector of FIG. 17.
Figure 20:
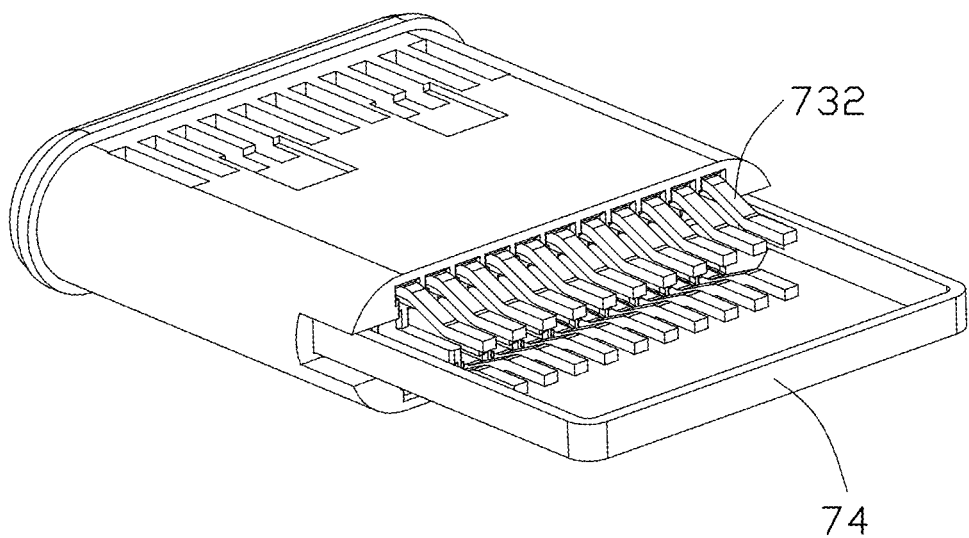
FIG. 20 is a partially assembled perspective view of the subassembly of the plug connector of FIG. 19.
Figure 21:
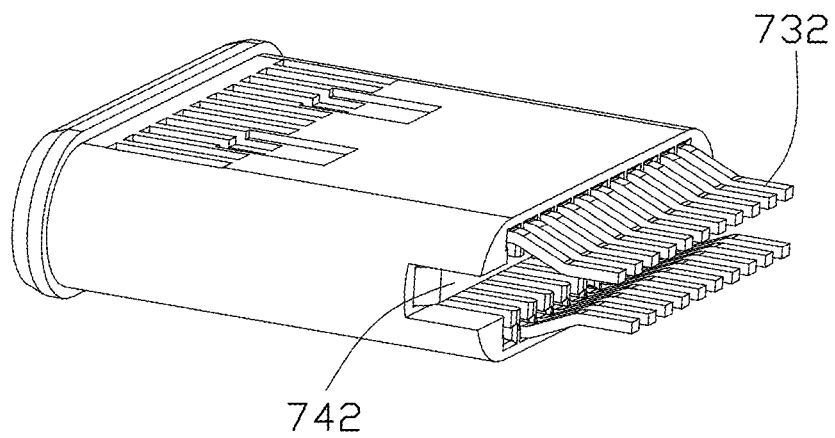
FIG. 21 is a partially assembled rear perspective view of a subassembly of the plug connector of FIG. 17.

Referring to FIG. 16, the plug connector 700 includes a paddle card 71 with circuit pads 711, 712 on two opposite surfaces. An insulative housing 72 located in front of the paddle card 71, is enclosed in a metallic shell 73. A cable 75 extends rearwardly from the paddle card 71 and includes therein a plurality of wires (not shown) respectively connected to a rear region of the paddle card 71. A cover 76 is overmolded on the shell 73, the paddle card 71 and the cable 75 to finalize the whole plug connector 700.

Combination with FIGS. 17-21, the insulative housing 72 defines a center slot 701 between two walls 721 each equipped with a plurality of deflectable contacts 73 in the corresponding passageways 722, respectively, each having a front contacting section 731 extending into the center slot 701 and a rear mounting section 732 mechanically and electrically connected to a front region of the corresponding circuit pads 711, respectively. A unitary latch clip 74 has a U-shaped configuration with two side arms 741 linked by a transverse bar 742. The housing forms the corresponding raceway 724 receiving the latch clip 74 therein. Each of the side arms 741 defines an inward pocket 743 facing inwardly toward the center slot 701 in a transverse direction. The transverse bar 742 is located between said two rows of contacts 73 and in front of the rear mounting section 732.

Figure 22:
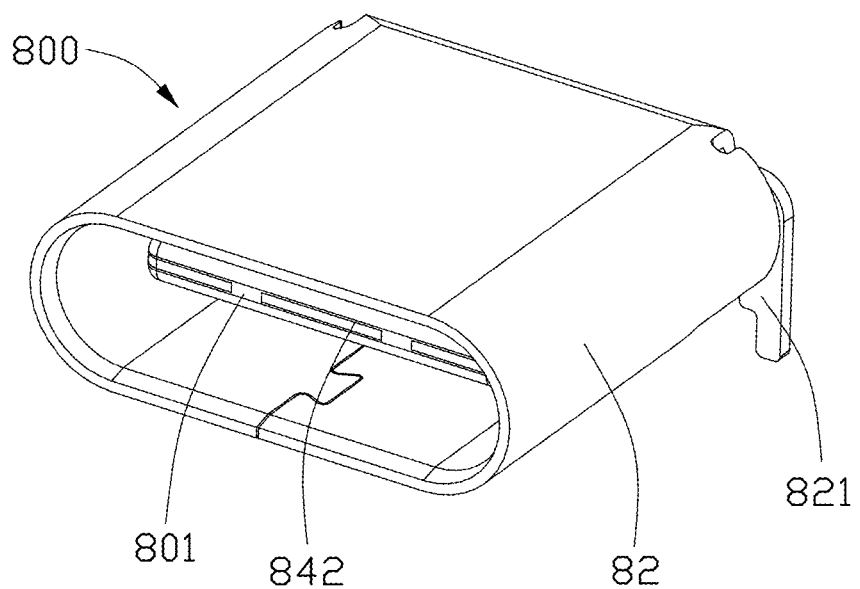
FIG. 22 is a perspective view of the receptacle connector of FIG. 14 mounted on the print circuit board.
Figure 23:
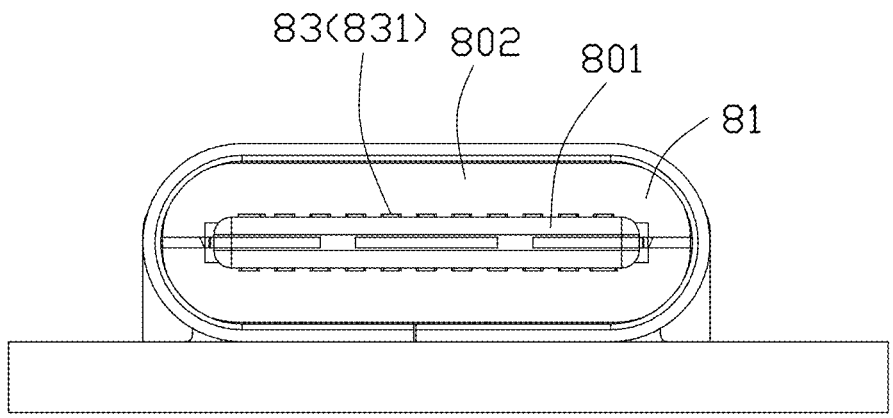
FIG. 23 is a front elevational view of the receptacle connector and the printed circuit board of FIG. 14.
Figure 24:
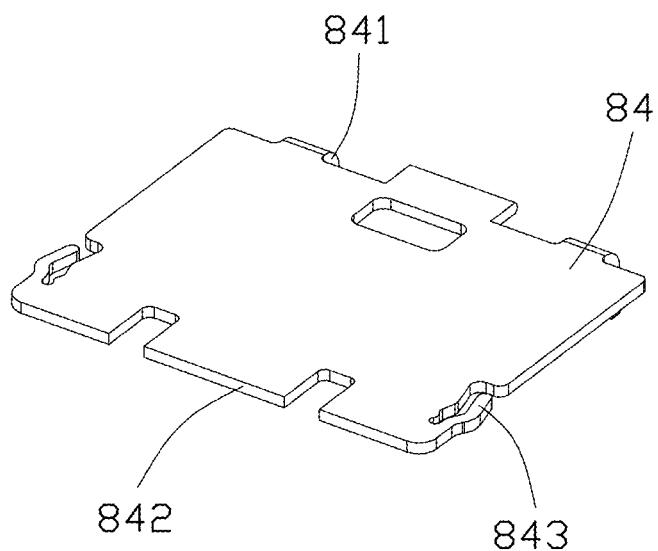
FIG. 24 is a perspective view of the shielding plate in the receptacle connector of FIG. 22.
Figure 25:
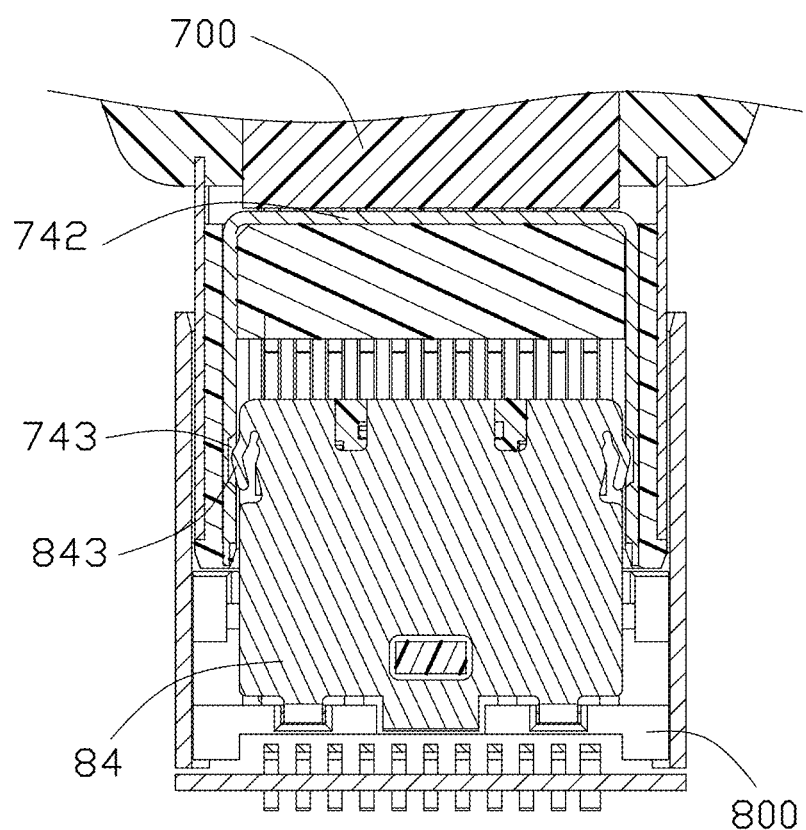
FIG. 25 is a cross sectional view of the plug connector and the receptacle connector taken along lines 25-25 of FIG. 13.
Figure 26:
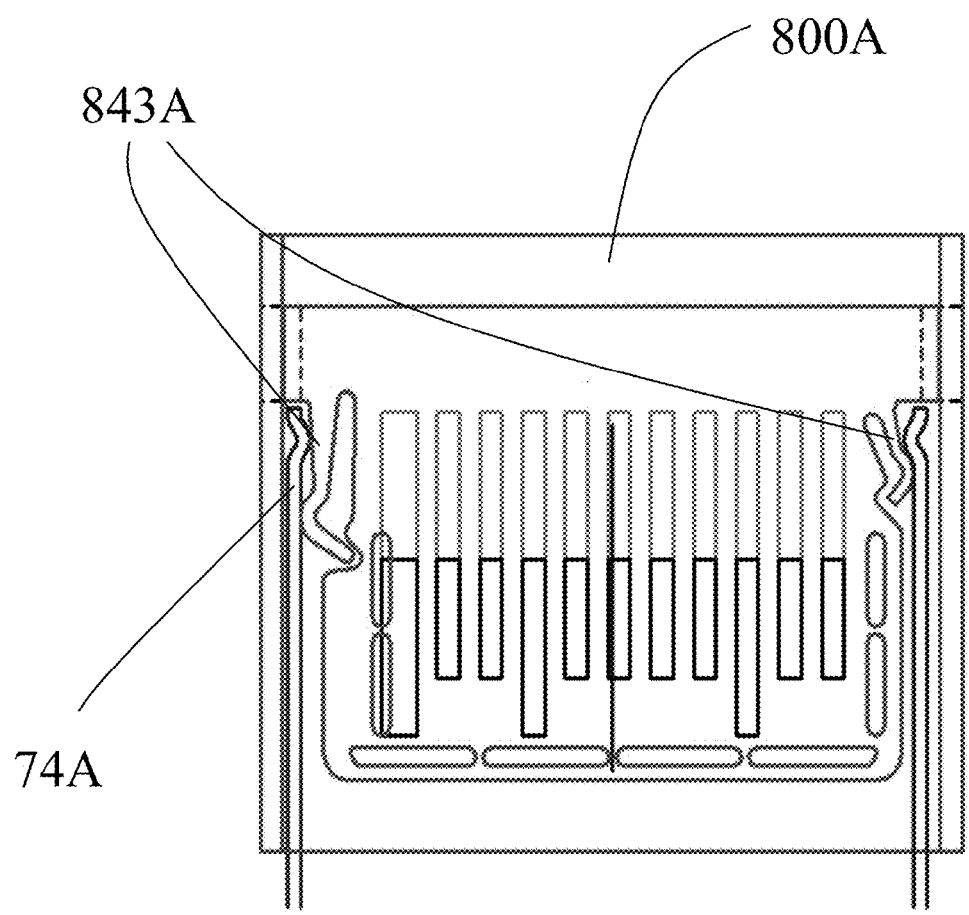
FIG. 26 show a first another embodiment of engagements between the shielding plate and the latch clip.
Figure 27:
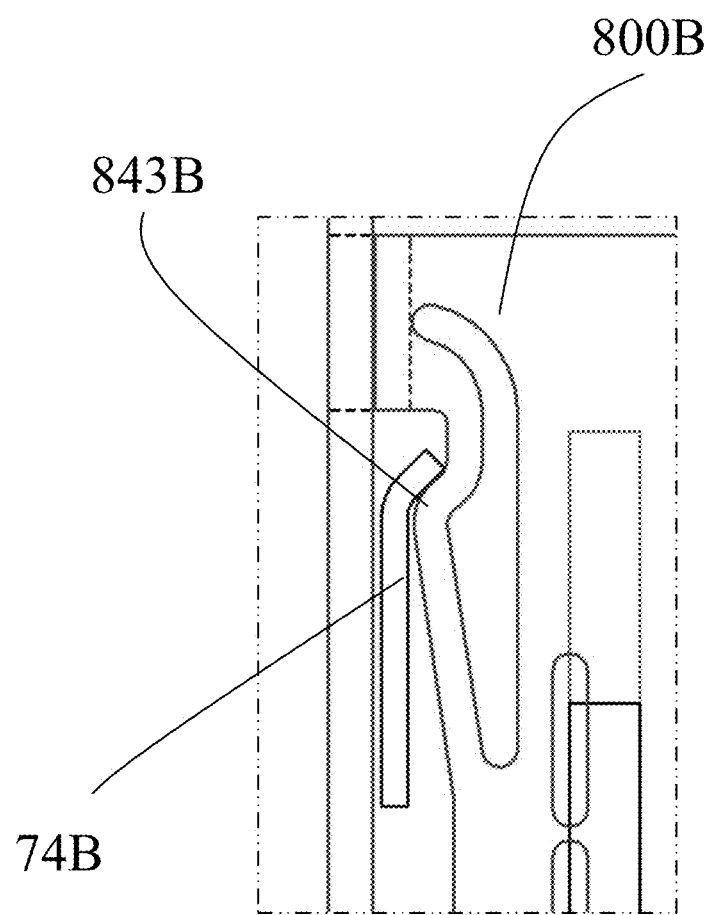
FIG. 27 show a second another embodiment of engagements between the shielding plate and the latch clip.
Figure 28:
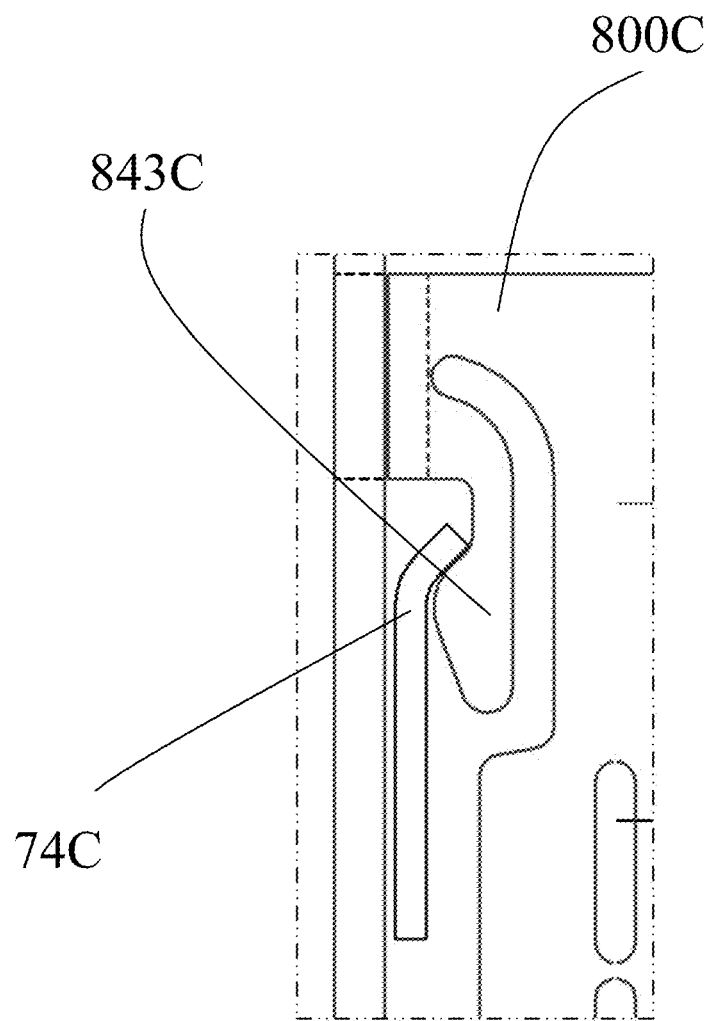
FIG. 28 show a third another embodiment of engagements between the shielding plate and the latch clip.
Figure 29:
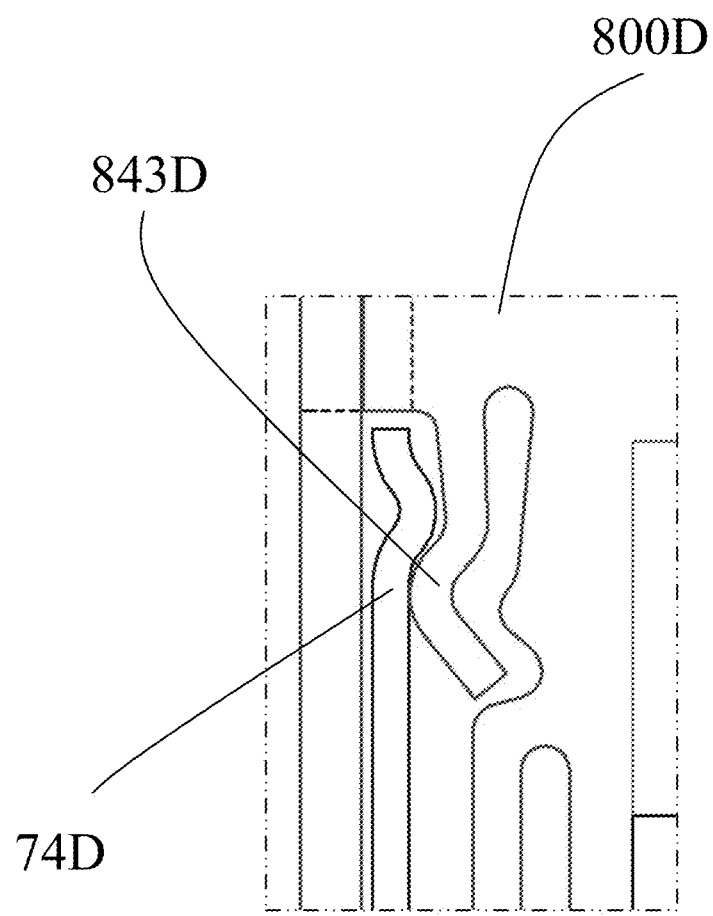
FIG. 29 show a fourth another embodiment of engagements between the shielding plate and the latch clip.
Figure 30:
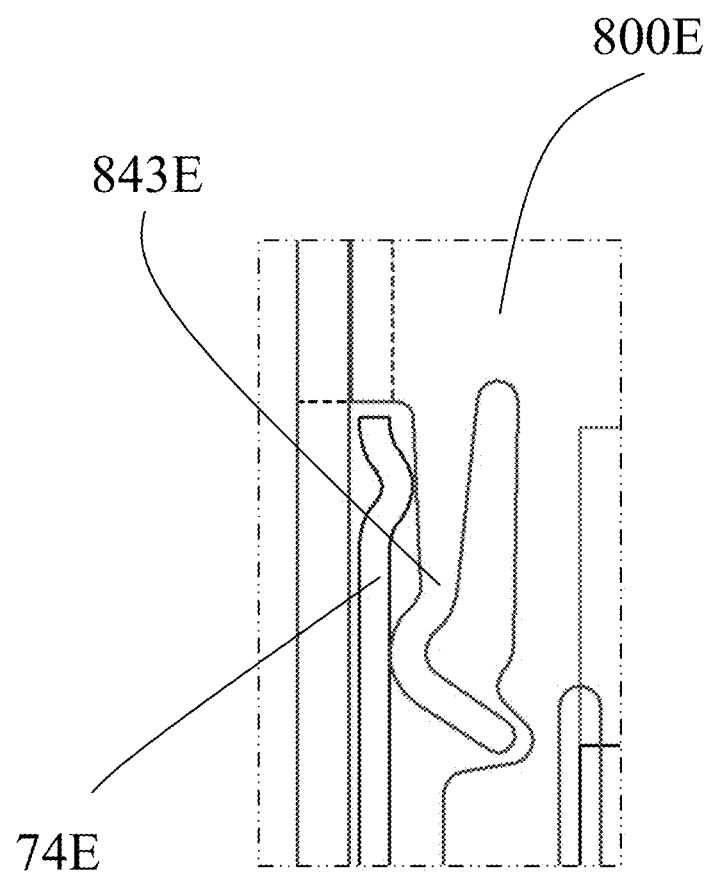
FIG. 30 show a fifth another embodiment of engagements between the shielding plate and the latch clip.
Figure 31:
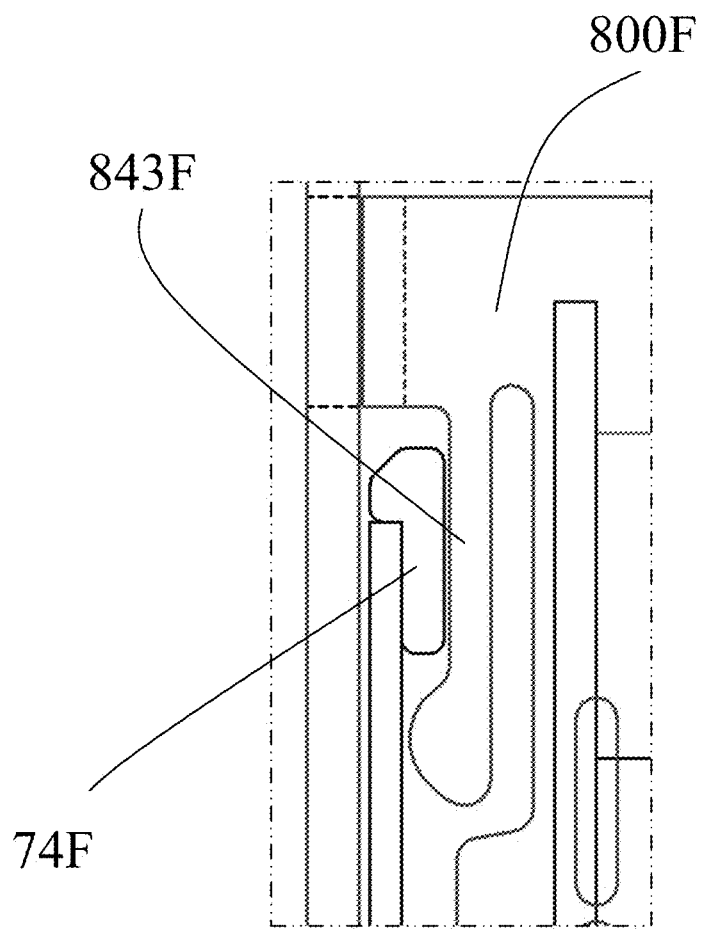
FIG. 31 show a sixth another embodiment of engagements between the shielding plate and the latch clip.

Referring to FIGS. 22-24, the receptacle connector 800 includes an insulative housing 81 with a forwardly extending mating tongue 801 thereof. A plurality of stationary contacts 83 are disposed in the housing 51 with contacting sections 831 exposed upon two opposite surfaces of the mating tongue 801 and mounting sections 832 (shown in FIG. 15) soldered upon the printed circuit board. A capsular metallic shell 82 encloses the housing 81 to define therein a mating port 802 in which the mating tongue 801 forwardly extends, and further unitarily forms a plurality of mounting legs 821 mounting to the printed circuit board 100. A metallic shielding/grounding plate 84 is disposed in the mating tongue 801 with the reinforcement function, and includes a rear mounting legs 841 for mounting to the printed circuit board, front protruding edge sections 842 exposed outside of the corresponding edges of the mating tongue 801 for preventing damage due to incorrect/tilted mating of the plug connector, and a pair of resilient bulged sections 843 on two lateral sides for engagement within the pocket 743 of the corresponding side arm 741 for retention between the shielding plate 84 and the latch clip 74 and also between the receptacle connector 800 and the plug connector 700 as shown in FIG. 25.

FIG. 26-31 show other embodiments wherein in FIG. 16 the bugled sections 743 on two lateral sides are offset from each other for not only reducing the insertion force but also forming two steps retention.

However, the disclosure is illustrative only, changes may be made in detail, especially in matter of shape, size, and arrangement of parts within the principles of the invention.

What is claimed is:

1. An electrical connector assembly comprising:
a receptacle connector adapted for mounted on a printed circuit board, the receptacle connector including:
an insulative housing defining a horizontal mating tongue;
a plurality of contacts disposed in the housing with contacting sections exposed upon two opposite surfaces of the mating tongue; and
a monolithic horizontal metallic shielding plate disposed and extending substantially fully the mating tongue with two bulged sections exposed and outwardly protruding outsides of two lateral edges of the mating tongue, respectively;
a plug connector intending to mate with the receptacle connector, the plug connector defining an insulative housing with a center slot therein, a plurality of contacts disposed in the insulative housing by two sides of the slots, and a latch clip including a pair of side arms located by two opposite ends of the center slot in the horizontal transverse direction, wherein during mating, the bulged sections of the shielding plate are engaged with the two opposite side arms for retention; wherein
the bulged sections are deflectable; wherein
each of the side arms defines an inward pocket facing toward the mating tongue to receive the corresponding bulged section during mating.

2. The electrical connector assembly as claimed in claim 1, wherein each of the side arms is fixed without deflection.

3. The electrical connector assembly as claimed in claim 1, wherein said shielding plate vertically shields most portions of said mating tongue.

4. An electrical connector assembly comprising:
a first connector including a mating tongue equipped with a plurality of first contacts on opposite surfaces of the mating tongue and a pair of metallic bulged sections exposed an outwardly protruding outside of two lateral edges of the mating tongue; and
a second connector adapted for mating with the first connector, the second connector including a plurality of second contacts and defining a center slot for receiving the mating tongue of the first connector and including a pair of latch side arms located by two opposite sides of the center slot in the horizontal transverse direction, each of said latch side arms defining a latch section with a configuration compliant with a contour of the corresponding bulged section, wherein
during mating, the bulged sections of the first connector are engaged with the latch section on the two opposite side arms for retention;
the bulged section is transversely deflectable; wherein
the mating tongue defines a pair of lateral notches and the pair of bulged sections are respectively located in the corresponding notches.

5. The electrical connector assembly as claimed in claim 4, wherein said latch section is fixed without traverse deflection thereof.

6. The electrical connector assembly as claimed in claim 4, wherein said first connector is connected with a cable and the second connector is mounted to a printed circuit board.

7. The electrical connector assembly as claimed in claim 4, wherein the pair of bulged sections are unitarily formed on a U-shaped structure surrounding a portion of a periphery of the mating tongue.

8. The electrical connector assembly as claimed in claim 4, wherein the pair of latch sections are unitarily formed on a U-shaped structure in an insulative housing of the second connector.

9. The electrical connector assembly as claimed in claim 4, wherein the second housing defines a slot in a rear side to receive a front edge of a paddle card where tails of the second contacts are mounted.

10. The electrical connector assembly as claimed in claim 4, wherein a monolithic horizontal metallic shielding plate is embedded within the mating tongue and vertically shields most portions of said mating tongue, and said pair of metallic bulged sections are formed on two opposite lateral edges of the shielding plate.

11. The electrical connector assembly as claimed in claim 10, wherein a contour of said shielding plate is similar to that of the mating tongue.

12. An electrical connector assembly comprising:
a plug connector defining a mating tongue with a plurality of stationary contacts on opposite surfaces thereon;
a pair of plug locking sections formed on opposite lateral sides of the mating tongue;
a cable located behind the mating tongue and mechanically and electrically connected to the stationary contacts;
a receptacle connector for mounting to a printed circuit board and including an insulative housing defining a receiving slot with a plurality of deflectable contacts located on two opposite sides of the receiving slot; and
a pair of receptacle locking sections disposed by two opposite lateral sides of the receiving slot for latching to the corresponding plug locking sections, respectively; wherein
said mating tongue is fully exposed to an exterior without circumferential shielding therewith;
wherein said pair of plug locking sections are unitarily formed on a U-shaped structure surrounding a front edge and partially a pair of lateral side edges of the mating tongue.

13. The electrical connector assembly as claimed in claim 12, wherein said plug locking sections are deflectable.

14. The electrical connector assembly as claimed in claim 12, wherein said receptacle locking sections are deflectable.

15. The electrical connector assembly as claimed in claim 12, wherein said mating tongue includes an upper insulator and a lower insulator commonly sandwiching a printed circuit board therebetween in a vertical direction.

16. The electrical connector assembly as claimed in claim 12, wherein said mating tongue defines a pair of lateral side notches in which the plug locking sections are located, respectively.

* * * * *